(12) United States Patent
Matsuoka et al.

(10) Patent No.: US 6,285,102 B1
(45) Date of Patent: Sep. 4, 2001

(54) DRIVE MECHANISM HAVING A GAS BEARING OPERABLE UNDER A NEGATIVE PRESSURE ENVIRONMENT

(75) Inventors: Takaaki Matsuoka, Tachikawa; Teruo Asakawa, Nakakoma-Gun, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/541,720

(22) Filed: Apr. 3, 2000

(30) Foreign Application Priority Data

Apr. 2, 1999 (JP) .................................................. 11-096148

(51) Int. Cl.[7] .............................. B65G 49/07; H02K 7/08
(52) U.S. Cl. ................................ 310/90; 384/12; 310/12; 414/676; 34/92
(58) Field of Search ........................... 384/12; 92/DIG. 2; 250/442.11, 441.11, 440.11; 310/90, 12, 13, 14, 15; 34/559, 92; 414/749.2, 676

(56) References Cited

U.S. PATENT DOCUMENTS

| | | | |
|---|---|---|---|
| 4,417,770 | * 11/1983 | Tucker | 384/12 |
| 4,626,749 | 12/1986 | Asakawa | 318/135 |
| 4,684,315 | * 8/1987 | Sugishima et al. | 414/749 |
| 4,818,838 | * 4/1989 | Young et al. | 250/441.11 |
| 5,501,569 | * 3/1996 | Yamakazi et al. | 414/676 |
| 5,686,941 | * 11/1997 | Kojima | 346/137 |
| 5,784,925 | * 7/1998 | Trost et al. | 74/490.09 |
| 5,803,979 | * 9/1998 | Hine et al. | 134/2 |
| 5,898,179 | * 4/1999 | Smick et al. | 250/492.21 |

FOREIGN PATENT DOCUMENTS

| | | | |
|---|---|---|---|
| 60-162731 | 10/1985 | (JP) . | |
| 62-088528 | 4/1987 | (JP) . | |
| 63-139844 | * 6/1988 | (JP) | H01L/21/68 |
| 5-161284 | * 6/1993 | (JP) | H02J/15/00 |
| 6-049529 | 6/1994 | (JP) . | |

* cited by examiner

*Primary Examiner*—Burton S. Mullins
(74) *Attorney, Agent, or Firm*—Pillsbury Winthrop LLP

(57) ABSTRACT

A drive mechanism provides a friction free movement of a movable member operated under a negative pressure environment. A gas bearing arrangement movably supports the movable element relative to a stationary element. The gas bearing arrangement is configured to be operated under the negative pressure environment inside the chamber. A drive arrangement drives the movable element from outside the chamber.

24 Claims, 10 Drawing Sheets

DRIVE MECHANISM HAVING A GAS BEARING OPERABLE UNDER A NEGATIVE PRESSURE ENVIRONMENT

BACKGROUND OF THE INVENTION

1. Field of the Invention

The present invention generally relates to drive mechanisms and, more particularly, to a drive mechanism which drives a movable member provided in a vacuum chamber such as a process chamber used for a semiconductor manufacturing process.

2. Description of the Related Art

In the manufacturing processes of semiconductor devices, liquid display devices (LCDs) or plasma display devices, accurate movement and positioning of a work piece such as a semiconductor wafer must be achieved under the vacuum or negative pressure (partial vacuum) environment. Accordingly, a handling device handling a work piece under the vacuum or negative pressure environment must be provided with a movable unit such as a conveyor arm which can accurately move and position the work piece. Such a handling device operated under the vacuum or negative pressure requires a special drive mechanism for driving the movable unit including a special bearing which movably supports the movable unit. Conventionally, a ball bearing or a roller bearing is used as a bearing for supporting the movable unit in a vacuum chamber.

Japanese Patent Publication No. 6-49529 discloses a method using a magnetic floating mechanism to convey an object within a vacuum chamber. According to the method, a work piece such as a wafer is mounted on a conveyor arm that floats within the vacuum chamber by being supported by a magnetic force applied by electromagnets provided outside the vacuum chamber. The conveyor arm conveys the work piece within the vacuum chamber. Accordingly, the conveyor arm does not produce dust or particles within the vacuum chamber since the conveyor arm can move within the vacuum chamber in the non-contact manner. However, said patent document does not disclose the floating mechanism of the conveyor arm and the method for controlling the floatation of the conveyor arm.

Japanese Laid-Open Patent Application No. 62-88528 discloses an X-Y stage, which uses an air bearing for floatation of a movable unit on a cushion of air and a linear motor for driving the movable unit. The stage is formed on the crossing part of two orthogonal cross guides. Each of the cross guides is provided with air bearings on opposite ends and a liner motor formed along each cross guide. However, this patent document does not disclose the specific structure of the air bearings and method for controlling the floating force achieved by the air bearings. A structure of a conventional air bearing is disclosed in Japanese Laid-Open Utility Model Application No. 60-162731.

Conventionally, a ball bearing or a roller bearing is used as a bearing for supporting a movable unit. However, when a ball bearing or a roller bearing is operated in a vacuum chamber, the pressure in the vacuum chamber may be increased due to gas discharged from the lubricant provided in the bearing. Additionally, the lubricant may scatter within the vacuum chamber due to rotation of the balls or rollers in the bearing, which contaminates the environment within the vacuum chamber. Further, friction in the bearing causes a delay in a start of movement and inaccuracy in a stop position. There is a further problem in that a high-speed operation cannot be performed since a vibration due to sliding must be prevented so as to safely hold and move a work piece.

As mentioned above, the method disclosed in Japanese Patent Publication No. 6-49529 does not use a mechanical contact bearing such as a ball bearing or a roller bearing. However, since the conveyor arrangement disclosed in Japanese Patent Application No. 6-49529 does not disclose the method of flotation control of the conveyor arm, the conveyor arm may contact the inner bottom surface of the vacuum chamber.

A gas bearing such as an air bearing is popular for a movable unit operated under a normal or atmospheric pressure. However, there has been no suggestion to apply a gas bearing to a negative pressure environment. Actually, neither the above-mentioned Japanese Laid-Open Patent Application No. 62-88528 nor Japanese Laid-Open Patent Application No. 60-162731 considers the use of a gas bearing under a negative pressure environment. That is, the gas bearing disclosed in those patent documents is generally arranged for use under a normal pressure. Therefore, the gas bearing so disclosed is unusable under a negative pressure environment since the gas bearing exhausts some amount of air or gas, which could raise the pressure thus eliminating the negative pressure environment.

As mentioned above, there has been no suggestion as to a bearing that enables movement and positioning of a movable unit in a conveyor system operated under a negative pressure environment. If a ball bearing or a roller bearing is used, the above-mentioned problems will rise.

Additionally, the conventional floating system using a magnetic force does not provide a lift control of a movable unit. For example, in the method disclosed in the above-mentioned Japanese Patent Application No. 6-49529, there may be a case in which the lift of the conveyor arm fluctuates and cannot be maintained at a constant level, or the conveyor arm vibrates. Additionally, if the movable unit is lifted in excess, an appropriate drive control cannot be performed, and a high-speed motion and a quick response cannot be achieved.

SUMMARY OF THE INVENTION

It is a general object of the present invention to provide an improved and useful drive unit in which the above-mentioned problems are eliminated.

A more specific object of the present invention is to provide a drive mechanism for driving a movable element, which drive mechanism can be operated under a negative pressure environment achieving an accurate movement and positioning of the movable unit.

Another object of the present invention is to provide a floating mechanism for floating a movable element with a stable floating height above a stationary element.

In order to achieve the above-mentioned objects, there is provided according to one aspect of the present invention a drive mechanism which comprises: a movable element situated inside a chamber which is set to a predetermined negative pressure environment; a gas bearing arrangement movably supporting the movable element relative to a stationary element, the gas bearing arrangement operating under the predetermined negative pressure environment inside the chamber; and a drive arrangement driving the movable element from outside the chamber.

According to the present invention, since the gas bearing arrangement is used, the movable element can be moved and/or rotated along the stationary element at a high speed without friction and vibration. The motion of the movable element may include one-dimensional motion, two-dimensional motion and three-dimensional motion.

Additionally, the movable element carrying an object does not vibrate. Further, since there is no friction such as static friction, the movable element can achieve a quick response when starting and stopping.

Additionally, there is provided according to another aspect of the present invention a drive mechanism which comprises: a chamber providing a predetermined negative pressure environment, the chamber having an inner surface; a movable element situated inside the chamber, the movable element having an opening from which a gas is ejected so that the movable element floats on a cushion of gas above the inner surface of the chamber; and a drive arrangement driving the movable element.

According to this invention, since the gas bearing arrangement is used, the movable element can be moved and/or rotated at a high speed without friction and vibration along the inner surface of the chamber. The motion of the movable element may include one-dimensional motion, two-dimensional motion and three-dimensional motion. Additionally, the movable element carrying an object does not vibrate. Further, since there is no friction such as static friction, the movable element 10 can achieve a quick response when starting and stopping.

Additionally, there is provided according to another aspect of the present invention a floating mechanism for floating a movable element on a stationary element. The drive support mechanism comprises: a gas bearing adapted to be connected to the movable element, the gas bearing ejecting a gas toward a surface of the stationary element so that the movable element floats above the surface of the stationary element; and a magnetic circuit generating a magnetic field which restrains the movable element to the surface of the stationary element.

According to this invention, a floating height of the movable element relative to the stationary element can be controlled by a magnetic restraining force generated by the magnetic circuit. Thus, a stable floatation of the movable element can be achieved.

Other objects, features and advantages of the present invention will become more apparent from the following detailed description when read in conjunction with the accompanying drawings.

DETAILED DESCRIPTION OF THE PREFERRED EMBODIMENTS

Figure 1:
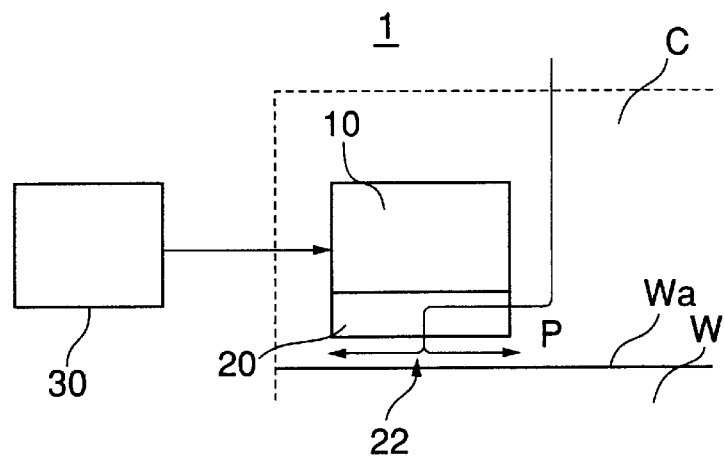
FIG. 1 is a block diagram of a drive mechanism according to the present invention.

A description will now be given of a principle of a drive mechanism according to the present invention. FIG. 1 is a block diagram of a drive mechanism according to the present invention.

The drive mechanism 1 comprises a movable element 10 placed on a work bench W, a gas bearing arrangement 20, and a drive unit 30. The movable element 10 and the gas bearing arrangement 20 are situated in a space C under a negative pressure environment. The work bench is not necessarily in the form of a bench as long as there is a surface Wa facing the movable element 10 in the space C. The movable element 10 is driven by the drive unit 30. The mode of movement of the movable element 10 includes a rotational movement, a rectilinear movement (one-dimensional movement) and a two-dimensional movement. The movable element 10 is embodied, for example, as a conveyor arm which conveys an object (not shown in the figure). When the movable element 10 is embodied as a conveyor arm, the movable element 10 may include a conveying unit and a supporting unit (not shown in the figure).

The air bearing arrangement 20 ejects a gas P between the movable element 10 and the surface Wa of the work bench so as to float the movable element 10 above the work bench W. Thereby, the movable element 10 can smoothly slide along the work bench W. The gas bearing arrangement 20 can be integrally formed with the movable element 10, or may be separated from each other. The gas bearing arrangement 20 builds a pressure between the movable element 10 and the surface Wa of the work bench W so as to float the element 10 above the surface Wa of the work bench W. Accordingly, the air bearing arrangement 20 includes an opening 22 to supply a gas P between the movable element 10 and the surface Wa so as to form a narrow gap therebetween. The opening 22 can be in the form of an aperture or an orifice.

The gas bearing arrangement 20 can control the flow of the gas P and a pressure of the gas P alone or in association with other parts. The control of the flow of the gas P is performed so as to prevent elimination of the negative pressure environment. The control of the flow of the gas P is also performed to adjust a floating height of the movable element 10 from the surface Wa of the work bench W. Alternatively, the flow control function can be achieved by using a part of the movable element 10. Additionally, the control of the floating height of the movable element 10 can be performed by the drive unit alone or in association with the air bearing arrangement 20. The control of the floating height of the movable element 10 can be achieved by a mass flow controller which controls a flow of the gas P. For example, the flow of the gas P can be controlled by a feedback control based on a sensor such as an electrostatic sensor which detects the height of the narrow gap between the movable element and the surface Wa of the work bench W.

The gas P is not limited to air, and an inert gas such as nitrogen or argon may be used. The gas bearing arrangement 20 is connected to an external container which stores the gas P so that the gas P is supplied from the external container to the gas bearing arrangement 20. An inert gas has an advantage that it does not contain oxygen which can cause oxidation or combustion.

The gas bearing arrangement 20 can be either a static pressure type or a dynamic pressure type. In the static pressure type gas bearing, the moving element floats above the work bench W by the supply or introduction of the gas P. In the dynamic pressure type gas bearing, the movable element 10 floats above the work bench W by a floating force generated by a flow stream of gas P which flow stream is generated by a motion of the surface of the work bench W. A typical example of the dynamic pressure type gas bearing can be seen in a hard disk drive in which a magnetic head floats on a hard disk by a floating force generated by an air stream generated by the rotation of the hard disk. Considering the object to be processed and the conveying and positioning of the object in the present embodiment, the static pressure type gas bearing is more suitable than the dynamic pressure type gas bearing.

The drive unit 30 drives the movable element 10 according to one of known methods such as a mechanical method, an electric method, a magnetic method, an optical method or a super conductive method or a combination of those methods. Accordingly, the drive unit 30 may include a direct drive mechanism which directly moves the movable element 10. Alternatively, the drive unit 30 may move the movable element 10 in a non-contact manner which utilizes a magnetic force. For example, the drive unit 30 may be magnetically coupled to the movable element 10 so as to transmits a drive force to the movable element 10 in the non-contact manner. More specifically, a permanent magnet may be provided to each of the movable element 10 and the drive unit 30 so that the same poles of the two permanent magnets face to each other, and the movable element 10 is driven by the magnet of the drive unit 30 approaching the magnet of the movable element 10 within the space C. The magnetic coupling can be achieved together with or without the gas bearing arrangement 20. Alternatively, a coil may be provided in the drive unit 30 and a permanent magnet may be provided in the movable element 10 so as to constitute a well known AC servo motor or a brushless DC servo motor. The motor or actuator may be constituted so that the magnetic circuit passes through a floating surface of the gas bearing arrangement. According to such an arrangement, a distance between the stationary part and the moving part can be reduced, which achieves an efficient magnetic circuit and maintains a constant distance. The entire structure or a part of the drive unit 30 may be situated within the negative pressure environment.

Additionally, movable element 10 may be provided with a plurality of coils, and the drive unit may generate a plurality of magnetic fields which are arranged in a two-dimensional array. The magnetic fields periodically vary in strength and polarity along the two-dimensional array so that the movable element can be moved along the X and Y axes under the control of currents supplied to the coils provided to the movable element 10. Such an arrangement and method for driving the movable element is known in the art as disclosed in U.S. Pat. No. 4,626,749.

As mentioned above, the drive unit 30 may perform not only a movement of the movable element 10 but also a control of the floating height of the movable element 10 in association with or instead of the air bearing arrangement 20. For example, consideration is made in a case in which the drive unit 30 is constituted by a magnetic means which is achieved by setting the drive unit 30 and the movable element 10 in the same polarity or in different polarities. In a case in which the drive unit 30 and the movable element 10 are set in the same polarity and are opposed to each other with the work bench W interposed therebetween, this arrangement assists the floatation of the movable element 10 since the drive unit 30 and the movable element 10 repel each other. In this arrangement, the drive unit 30 can drive the movable element 10 in the non-contact manner by being magnetically coupled to the movable element 10. Additionally, the drive unit can also control the floating height of the movable element 10 with respect to the work bench W.

On the other hand, in a case in which the drive unit 30 and the movable element 10 are set in different polarities and are opposed to each other with the work bench W interposed therebetween, this arrangement restricts the floatation of the movable element 10 since the drive unit 30 and the movable element 10 attract each other. It should be noted that if the drive unit 30 and the movable element 10 are set in the same polarity and the drive unit 30 is positioned above the movable element 10, this arrangement also restricts the floatation of the movable element 10 since the drive unit 30 and the movable element 10 repel each other. If the magnetic means of the drive unit 30 is constituted by an electromagnet such as a coil winding, the floating height of the movable element 10 can be controlled by varying a current supplied to the coil winding.

In operation, when the drive unit 30 drives the movable element 10, the movable element 10 moves and/or rotates in a desired direction along the surface Wa of the work bench W. If the movable element carries an object, the object is also moved and/or rotated together with the movable element 10. Since the gas bearing arrangement 20 is used, the movable element can be moved and/or rotated at a high speed without friction and vibration. The motion of the movable element may include one-dimensional motion, two-dimensional motion and three-dimensional motion. Additionally, the part of the movable element 10 carrying the object does not vibrate. Further, since there is no friction such as a static friction, the movable element 10 can achieve a quick response when starting and stopping.

If a mechanical bearing such as a ball bearing or a roller bearing is used to movably support the movable element 10 on the surface Wa of the work bench W, a vibration is generated due to friction. The vibration may increase when the movable element moves at a high speed, which may result in an offset in the position of the movable element 10. Additionally, the mechanical bearing uses a lubricant to reduce a frictional force, and, thereby, particles may be generated by the lubricant which contaminates the environment of the space C.

On the other hand, since the drive mechanism according to the present embodiment does not use a lubricant and the movable element does not contact the work bench W, there is no problem with respect to the generation of vibration and particles associated with the use of a mechanical bearing.

The ball bearing or the roller bearing may be easily sealed when it is used as a bearing for supporting a rotational motion since an end of a rotational member can be sealed by a sealing arrangement such as a magnetic fluid seal. On the other hand, it is not easy to provide a seal to a mechanical bearing which supports a rectilinear motion since such a mechanical bearing must move a relatively long distance. Accordingly, for example, it is difficult to arrange semiconductor process chambers along a straight line within a negative pressure environment. On the other hand, since the drive mechanism 1 according to the present embodiment uses the gas bearing arrangement 20 which does not have the above-mentioned problems, the drive mechanism 1 according to the present embodiment can be used for an LCD manufacturing process, a plasma display manufacturing process or a semiconductor device manufacturing process.

Additionally, as mentioned above, the mechanical bearing such as a ball bearing or a roller bearing requires a large area for a rolling part and a large amount of lubricant to reduce a frictional force. The lubricant accommodated in the mechanical bearing may scatter and a gaseous component may be discharged from the lubricant, which conditions undesirably reduces the negative pressure environment. The mechanical baring may be used without lubricant, but such a mechanical bearing is not suitable for a high-speed use and its service life may be reduced due to friction. Additionally, a large amount of particles may be produced since the moving part of the mechanical bearing moves by being brought in contact with the opposite surface. On the other hand, the drive mechanism 1 according to the present embodiment neither scatters a lubricant nor produce particles since the gas bearing arrangement 20 does not use a lubricant and the movable element 10 moves along the surface Wa in the non-contact manner.

Figure 2:
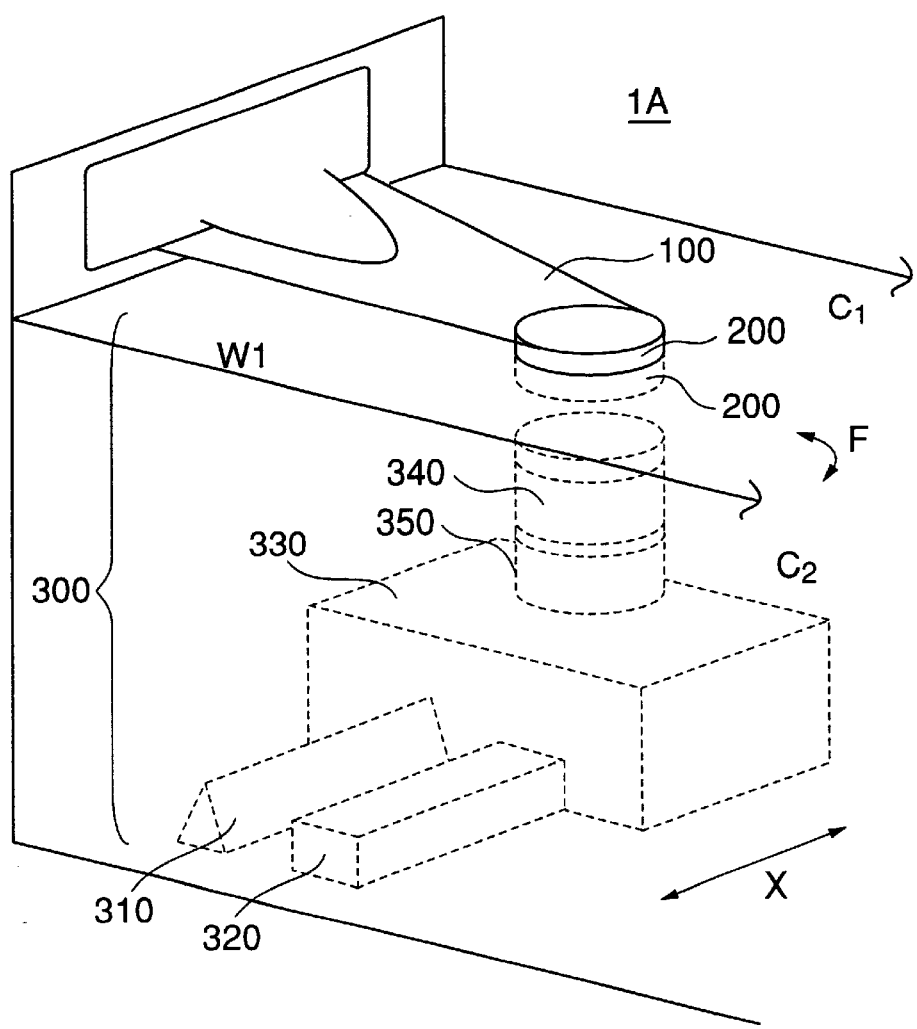
FIG. 2 is a perspective view of a drive mechanism according to a first embodiment of the present invention.

A description will now be given, with reference to FIGS. 2 through 6, of a first embodiment of the drive mechanism 1 according to the present invention. FIG. 2 is a perspective view of a drive mechanism 1A according to the first embodiment of the present invention.

The drive mechanism 1A shown in FIG. 2 comprises a conveyor arm 100, a pair of air bearings 200 and an arm drive unit 300. One of the gas bearings 200 is mounted to the conveyor arm 100, and the other is mounted on the arm drive unit 300. The conveyor arm 100 and the one of the gas bearings 200 are located in a closed space C1, and the arm drive unit 300 and the other one of the gas bearings 200 are located in a space C2 which can be either a closed space or an open space. The closed space C1 and the space C2 are separated from each other by an isolating wall W1

In FIG. 2, the closed space C1 is rendered to be a predetermined negative pressure environment. That is, the closed space C1 in which one of the air bearings 200 is located is maintained at a negative pressure or a partial vacuum. In order to reduce a pressure applied to the isolating wall W1, it is preferable that the pressure in the closed space C2 in which the arm drive unit 300 is located be also set close to the predetermined negative pressure of the closed space C1. Accordingly, hereinafter, it is assumed that the space C2 is also a closed space.

In a case in which the drive mechanism 1A is applied to an LCD display manufacturing apparatus, a plasma display manufacturing apparatus or a semiconductor manufacturing apparatus, a negative pressure conveyor chamber may be divided into the closed space C1 and the closed space C2, and the exhaust of the closed space C1 is routed through the closed space C2. In such an arrangement, the volume of the closed space C1, which requires a stringent control of the level of cleanliness, can be reduced. Additionally, simplification of the structure of the closed space C1 facilitates the control of the level of cleanliness in the closed space C1.

Figure 3:
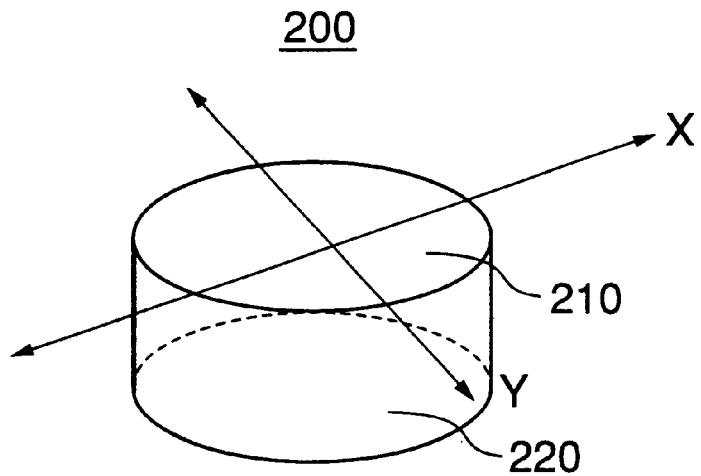
FIG. 3 is an enlarged perspective view of a gas bearing provided in the drive mechanism shown in FIG. 2.
Figure 4:
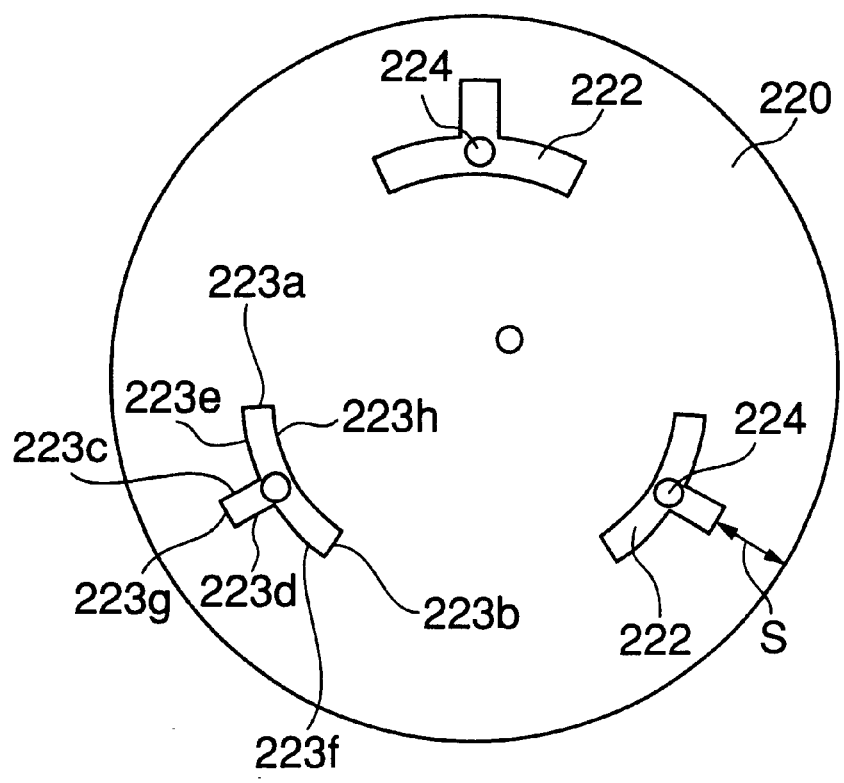
FIG. 4 is an enlarged plan view of a bottom surface of the gas bearing shown in FIG. 3.
Figure 5:
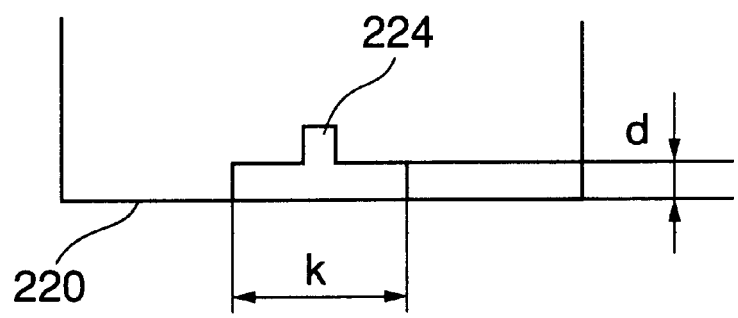
FIG. 5 is an enlarged cross-sectional view of the gas bearing shown in FIG. 3.

FIG. 3 is an enlarged perspective view of the gas bearing 200 provided in the drive mechanism 1A shown in FIG. 2. FIG. 4 is an enlarged plan view of a bottom surface of the gas bearing 200 shown in FIG. 3. FIG. 5 is an enlarged cross-sectional view of the gas bearing 200 shown in FIG. 3.

The conveyor arm 100 is an example of the movable element 10 shown in FIG. 1. The conveyer arm 100 holds an object such as a circular wafer or a square LCD by a conveyor part 150 (refer to FIG. 11) formed on an end thereof, and conveys the object to a predetermined position. The conveyor arm 100 may be configured to be suitable for the configuration of the object to be conveyed. At least one air bearing 200 is connected to a bottom surface of the conveyor arm 100 at an end opposite to the end where the conveyor part 150 is provided.

It should be noted that a magnetic member (not shown in the figure) is provided between the conveyor arm 100 and the gas bearing 200. The magnetic member magnetically couples to a rotational part 340 of the arm drive unit 30 in a non-contact manner. Additionally, for the purpose of illustrative convenience, in FIG. 2, only one air bearing 200 is mounted to each of the conveyor arm 100 and the arm drive unit 300.

The gas bearings 200 are located in the respective closed spaces C1 and C2 with the isolating wall W1 interposed therebetween. As shown in FIG. 3, the gas bearing 200 located in the closed space C1 has a cylindrical shape having an top surface 210 and a bottom surface 220. The bottom surface 220 is immediately above the isolating wall W1. The shape of the air bearing 200 is not limited to the cylindrical shape. The cylindrical shape is suitable for both the rotational motion and the two-dimensional movement of the conveyor arm 100. If the rectilinear motion is needed, the air bearing 200 may be connected to a rail (not shown in the figure) which enables the rectilinear motion of the conveyor arm 100.

It is preferable that the gas bearing 200 be formed in a symmetric shape so that the gas bearing 200 can float in a flat and stable position. It should be noted that a plurality of the gas bearings 200, for example, three gas bearings 200 may be provided to the conveyor arm 100 as described later so as to support the conveyor arm 100 in a preferred position.

The gas bearing 200 is connected to an external gas supply source (not shown in the figure) so that a gas is introduced into the gas bearing 200 and is ejected therefrom. The gas supplied by the external gas supply source is not limited to a specific kind of gas. However, if the drive mechanism 1A is applied to an LCD manufacturing apparatus, a plasma display apparatus or a semiconductor display apparatus, air or an inert gas such as nitrogen or argon may preferably be used. The inert gas has an advantage in that the object to be processed is not oxidized since the inert gas does not contain oxygen.

As shown in FIG. 4, the bottom surface 220 of the gas bearing 200 is provided with three T-shaped grooves 222 having the same configuration and size. Each of the T-shaped grooves 222 is defined by straight sides 223a, 223b, 223c and 223d; arc-like sides 223e and 223f which are parts of a first concentric circle of the circle defining the bottom surface 220 of the gas bearing 200 and having the center O; an arc-like side 223g which is a part of a second concentric circle of the circle defining the bottom surface 220; and an arc-like side 223h which is a part of a third concentric circle of the circle defining the bottom surface 220. As shown in FIG. 5, each of the T-shaped grooves 222 has a predetermined width k and a predetermined depth d. The shape of each of the grooves is not limited to the T-shape. However, it is preferable that the each of the grooves be formed in a symmetric shape with respect to a radius of the circle defining the bottom surface 220 so that the air bearing 200 is well balanced.

A gas introducing opening 224 is provided at the intersection of the grooves forming each of the T-shaped grooves 222. The gas introducing opening 224 is formed in a hard material such as sapphire, and is connected to the external gas supply source. The three gas introducing openings 224 are arranged in equiangular positions along a fourth concentric circle having the center O. It should be noted that the number of the gas introducing openings 224 is not limited to three. It is preferable that the gas introducing openings 224 be arranged symmetrically with respect the center O so as to achieve a well balanced support of the gas bearing.

For example, if the gas bearing 200 has a cylindrical shape having a diameter of 30 mm and a height of 10 mm, the width k is preferably 1 mm and the depth d is preferably about 10 $\mu$m and a diameter of the gas introducing opening 224 is preferably in the range of 0.1 $\mu$m to 60 $\mu$m. A distance S between the contour of the bottom surface 20 and each of the T-shaped grooves 222 is preferably be as close to zero as possible since the bearing area of the gas bearing 200 is increased, which stabilizes the gas bearing 200 in a floating state.

The present inventors found that when the three-point supporting arrangement was used as shown in FIG. 4, the amount of gas necessary for floating the gas bearing 200 together with the conveyor arm 100 was reduced and less floating height fluctuation occurred as fluctuations in the load were applied to the gas bearing 200. The less the amount of the gas for floatation, the less the possibility of loss of the negative pressure environment of the closed space C1. The floating height is reduced as the load applied to the gas bearing 200 is increased. However, the lesser fluctuation in the floating height with respect to the fluctuation in the load is preferable to facilitate the control of the floating height.

As shown in FIG. 2, the arm drive unit 300 comprises a first rail 310, a second rail 320, a rectilinear motion part 330 and a rotational motion part 340. In the arm drive unit 300, the rectilinear motion part 330 is movable in directions indicated by the arrows X and the rotational part 340 is movable in directions indicated by the arrows F. Accordingly, the movement of the conveyor arm 100 can be controlled in those directions. This arrangement is suitable for a semiconductor manufacturing apparatus having an inline chamber. Additionally, as described later with reference to FIG. 9, if the rectilinear motion part 330 is configured to be movable in two dimensions, the conveyor arm 100 can be moved in an arbitrary direction on the isolating wall W1. Such an arrangement is suitable for a semiconductor manufacturing apparatus having a radial or inline chamber.

The rectilinear motion part 330 moves along the first and second rails 310 and 320. The first rail 310 has a triangular cross section such as an equilateral triangular cross section. The second rail 320 has a rectangular cross section such as a square cross section. According to such an arrangement, the rectilinear motion part 330 is prevented from interfering with each of the first and second rails 310 and 320. The first and second rails 310 and 320 are not limited to the above-mentioned configurations, and other triangular shapes or a cylindrical shape may be used. It should be noted that the first and second rails 310 and 320 may have the same configuration if required.

Figure 6:
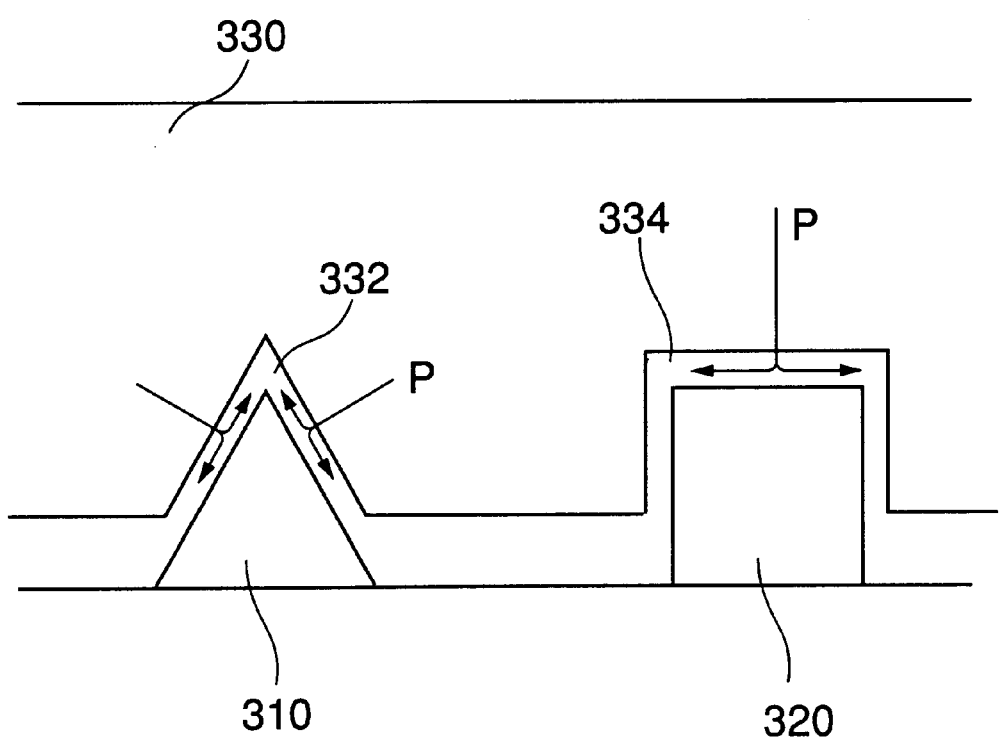
FIG. 6 is a cross sectional view of a part of a rectilinear motion part.

As shown in FIG. 6, the rectilinear motion part 330 is provided with grooves 332 and 334 which receive the first and second rails 310 and 320, respectively. The gas P is introduced between the rectilinear motion part 330 and each of the first and second rails 310 and 320 so as to form a gas bearing arrangement. Such a gas bearing arrangement is preferable since the gas bearing arrangement is located in the space C2 which is rendered to be a negative pressure environment similar to the closed space C1. As a result, the rectilinear motion part 330 can float on the first and second rails 310 and 320 so as to achieve a high-speed movement and a quick stop.

Figure 7:
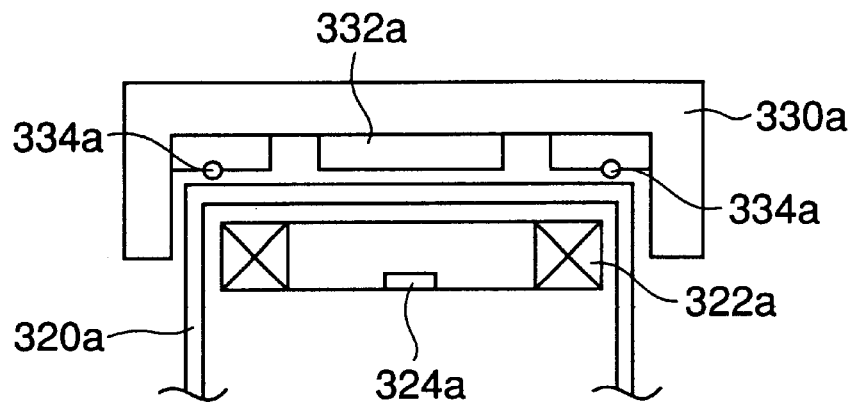
FIG. 7 is a cross-sectional view of a part of a variation of an arm drive unit shown in FIG. 2.

The rectilinear motion part 330 can move in the directions indicated by the arrows X by mechanical means, magnetic means or electric means. The gas bearing arrangement is not always required for the rectilinear motion part 330. Consideration can be given to an arrangement comprising a movable part 330a and a rail 320a as shown in FIG. 7. FIG. 7 is a cross sectional view of a part of a variation of the arm drive unit 300 shown in FIG. 2. The movable part 330a comprises an electromagnet 332a and ball bearings 333a. The rail 320a comprises a plurality of armature coils 322a and Hall elements 323a. The movable part 330a is a variation of the rectilinear motion part 330 and the rail 320a is a variation of the second rail 320.

In the example shown in FIG. 7, the movable part 330a uses the pair of ball bearings 333a instead of the air bearing arrangement. A lubricant may be applied to the ball bearings 333a and the rail 320a. The movable part 330a is provided with a drive magnet 332a. The drive magnet 332a has opposite poles alternatively arranged along the direction of movement (corresponding to the direction indicated by the arrow X) of the movable part 330a.

The armature coils 322a form a plurality of groups, each of which comprises about three adjacent armature coils 322a. A drive current can be separately supplied to each of the groups of the armature coils 322a so that the movable part 330a is moved by a force generated by the cooperation of the drive current and the magnetic fields generated by the drive magnet 332a.

Figure 8:
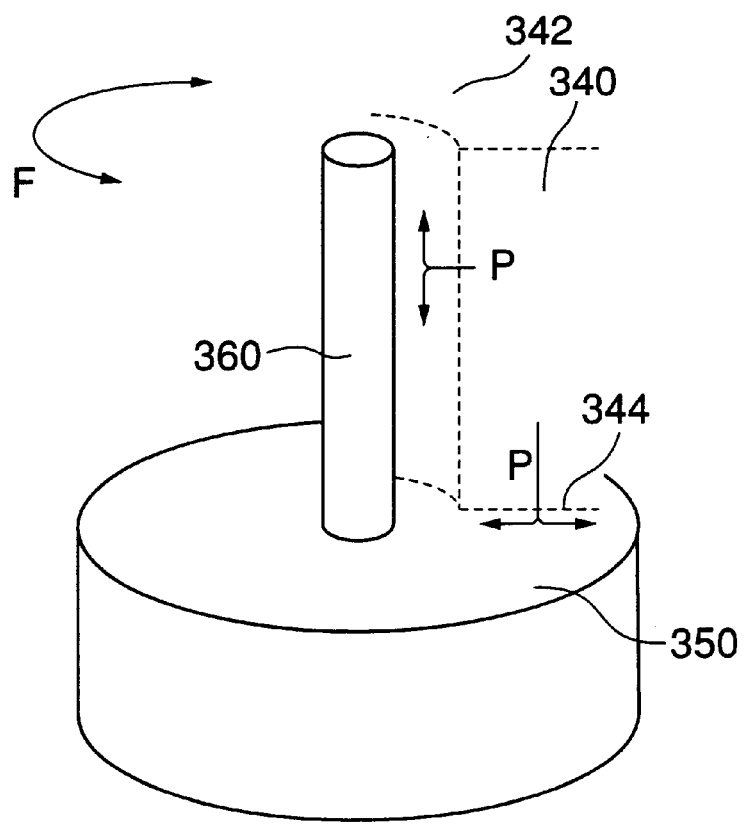
FIG. 8 is a perspective view of a support member supporting a rotational motion part shown in FIG. 2.

A description will now be given, with reference to FIG. 8, of the structure of the rotational motion part 340. FIG. 8 is a perspective view of a support member supporting the rotational motion part 340.

The arm drive unit 300 comprises a support table 350 fixed to the movable part 330 to support a rotational part 340 and a shaft 360 fixed to the movable part 330. The rotational part 340 has a cylindrical shape having a top surface 342 and a bottom surface 344. The top surface 342 is connected to the surface 210 of the gas bearing 200, and the bottom surface 344 faces the support table 350. Accordingly, the rotational part 340 can freely rotate about the shaft 360 together with gas bearing 200. The gas P is supplied between the rotational part 340 and each of the support table 350 and the shaft 360 so as to achieve a gas bearing arrangement. Such a gas bearing arrangement is preferable since there is a possibility that the closed space C2 will be rendered to be a negative pressure environment as is the same as the closed space C1 so as to reduce a pressure differential applied to the isolating wall W1. As a result, the rotational part 340 can be freely rotated up to a full 360 degrees as indicated by the arrows F in FIG. 2 at a high speed, and can be quickly stopped.

In the embodiment shown in FIG. 2, the movable part 330 can move only in the directions indicated by the arrow X. However, the directions of movement of the movable part 330 are not limited to the directions indicated by the arrow X (one-dimensional movement). For example, the structure constituted by the movable part 330 and the first and second rails 310 and 320 may be stacked one on another rotated at 90 degrees to each other so that the movable part 330 can perform a two dimensional (X-Y) movement.

Figure 9:
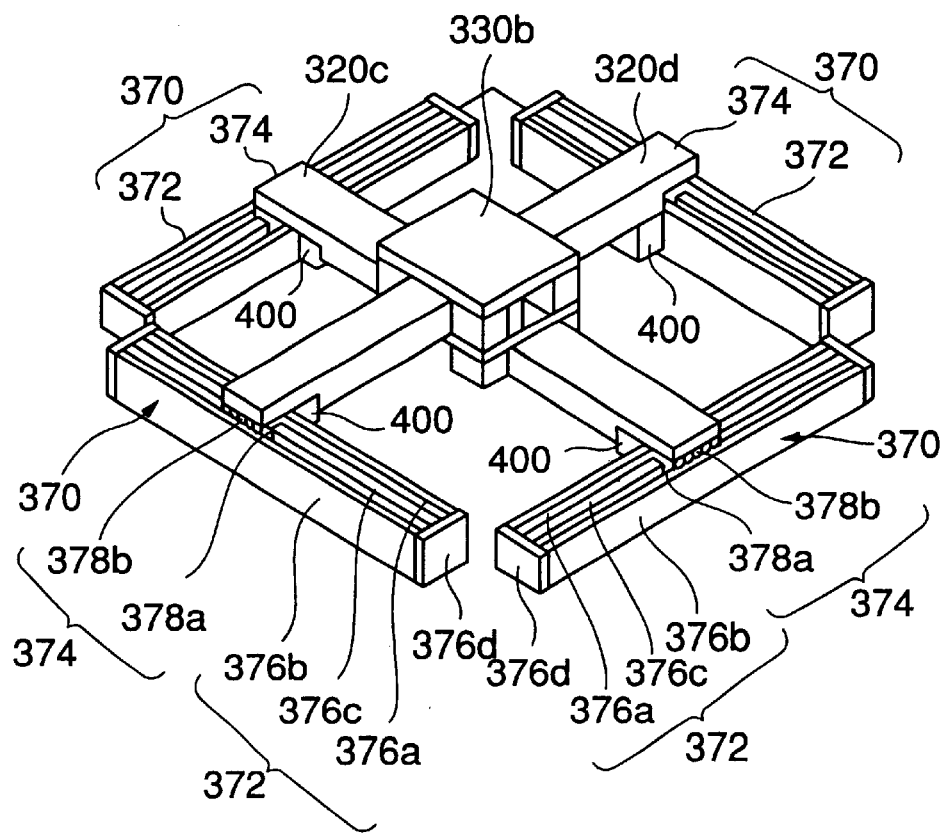
FIG. 9 is a perspective view of an X-Y stage.
Figure 10:
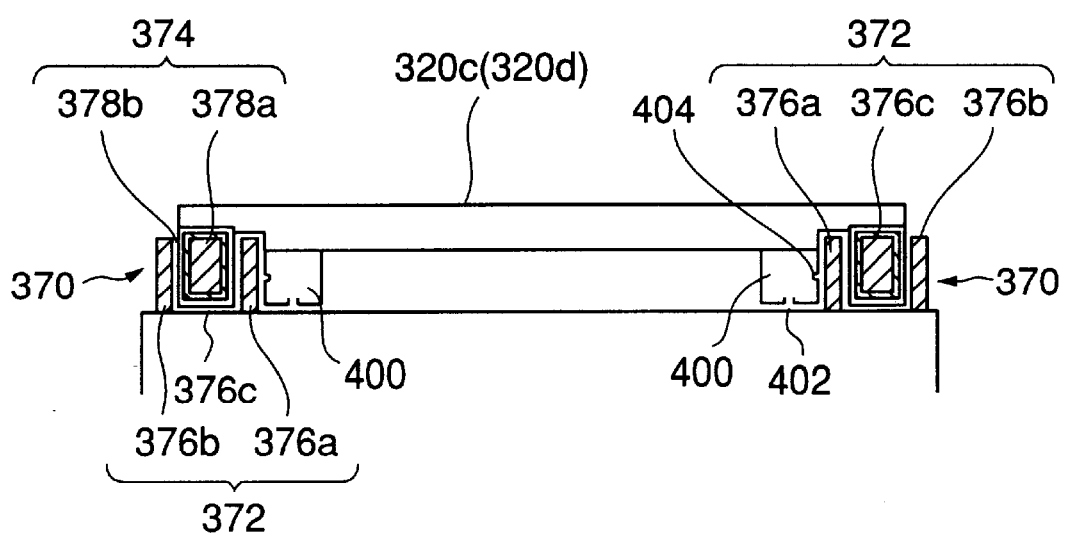
FIG. 10 is a cross-sectional view of the X-Y stage shown in FIG. 9.

The movable part 330 may be replaced by an X-Y stage 330b as shown in FIGS. 9 and 10. FIG. 9 is a perspective view of the X-Y stage 330b. FIG. 10 is a cross-sectional view of the X-Y stage 330b shown in FIG. 9.

The X-Y stage 330b is connected to both the cross guides 320c and 320d which extend perpendicular to each other. Each end of each of the cross guides 320c and 320d is provided with a movable part 374 which constitutes a linear motor 370 together with a stationary part 372 as shown in FIG. 9. The stationary part 372 comprises an inside yoke 376a, an outside yoke 376b and a center yoke 376c. The center yoke 376c is positioned between the inside yoke 376a and the outside yoke 376b and is fixed by side yokes 376d on opposite ends thereof. The yokes 376a, 376b and 376c are provided with a plurality of permanent magnets arranged along the longitudinal direction thereof so that the polarities of adjacent permanent magnets are opposite to each other. The movable part 374 comprises a conductive bobbin 378a and a drive coil 378b wound on the conductive bobbin 378a.

A gas bearing unit 400 is mounted on each end of each of the cross guides 320c and 320d. The gas bearing unit 400 has a gas ejecting openings 402 and 404. The gas ejecting opening 402 is provided on the bottom side thereof so that a gas can be ejected toward a base table on which the X-Y stage 330b is placed. The gas ejecting opening 404 is provided on a side of the gas bearing unit 400 so that the gas can be ejected toward the inside yoke 376a of the stationary part 372 which faces the gas bearing unit 400.

The X-Y stage 330b shown in FIG. 9 may be provided to a positioning device so as to serve as a moving part. Such a positioning device can be applied to a semiconductor manufacturing apparatus having a plurality of chambers.

Figure 11:
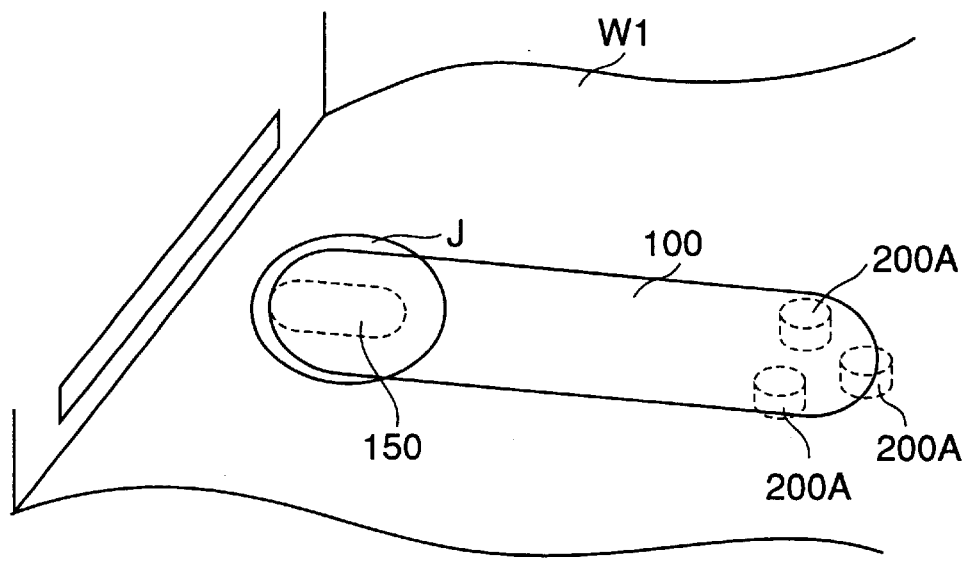
FIG. 11 is a perspective view of a conveyor arm situated in a closed space shown in FIG. 2.

A description will now be given, with reference to FIGS. 11 and 12, of the connection between the conveyor arm 100 and the arm drive unit 300. In FIG. 11, the conveyor arm 100 has an elongated shape so that an object J such as a wafer can be placed on the top side of one end thereof and three gas bearings 200A are mounted on the bottom side of the other end. The purpose of providing a plurality of gas bearings is to stabilize a position of the conveyor arm 100. The number and the arrangement of the gas bearings 200A and the size and configuration of each of the gas bearings 200A may be changed in accordance with the configuration and structure of the conveyor arm 100.

It should be noted that each of the gas bearings 200A in a first set of three gas bearings has the same structure as the gas bearing 200 shown in FIG. 3, and the gas bearings 200A are arranged on corners of an equilateral triangle. A second set of three gas bearings 200A are provided in the closes space C2 so that each of the gas bearings 200A of the second set is opposite to the respective one of the gas bearings 200A of the first set mounted on the conveyor arm 100.

Figure 12:
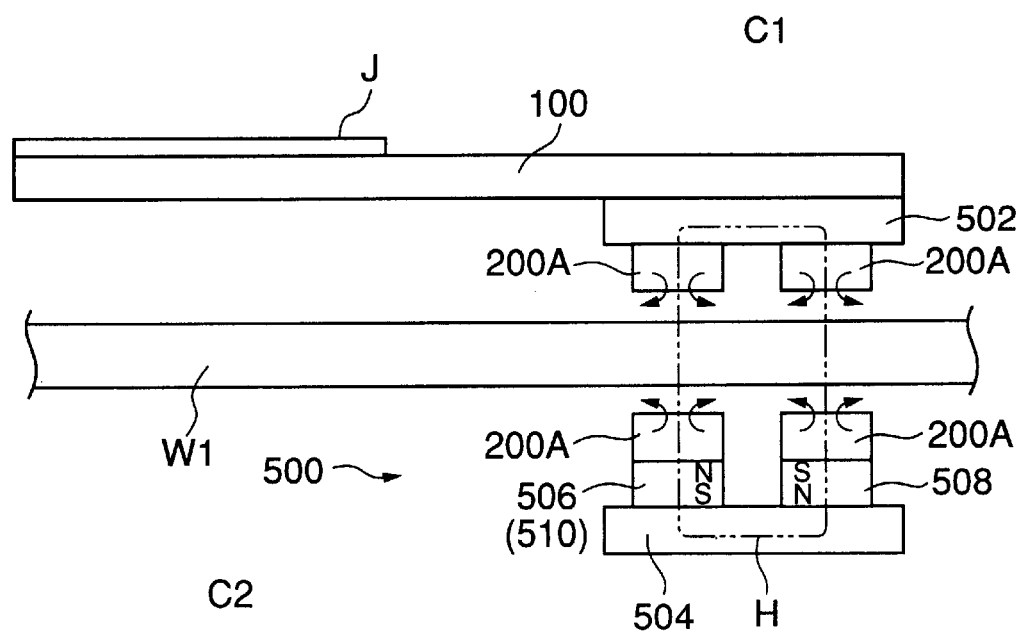
FIG. 12 is an enlarged cross-sectional view of a part of the conveyor arm shown in FIG. 11.

More specifically, as shown in FIG. 12, a yoke 502 made of a magnetic material is provided between the conveyor arm 100 and the gas bearings 200A in the closed space C1. Additionally, in the closed space C2, the gas bearings 200A are mounted to the rotational part 340 via a yoke 504 and three permanent magnets 506, 508 and 510, respectively. The yokes 502 and 504 and the magnets 506, 508 and 510 together constitute a closed loop magnetic circuit 500. As can be appreciated from FIG. 12, the permanent magnets 506 and 508 are positioned so that their polarities are opposite to each other. In FIG. 12, the permanent magnet 506 is positioned so that the S-pole side faces the yoke 504 and the permanent magnet 508 is positioned so that the N-pole side faces the yoke 504. The polarity of the permanent magnet 510 can be the same as either of the permanent magnets 506 and 508. In the above-mentioned structure, the conveyor arm 100 and the arm drive unit 300 are magnetically coupled by the magnetic circuit 500 in a non-contact manner.

The magnetic circuit 500 according to the present embodiment has several functions. First, the magnetic circuit 500 can transmit a drive force generated by the arm drive unit 300 to the conveyor arm 100 since the magnetic circuit 500 magnetically couples the conveyor arm 100 to the arm drive unit 300. Accordingly, the movement of the object J can be controlled by controlling the movement of the movable part 330 and the rotation of the rotational part 340 of the arm drive unit 300. Since the magnetic circuit 500 couples the conveyor arm 100 and the arm drive unit 300 in the non-contact manner, the closed space C1 can be separated from the closed space C2 by the isolating wall W1.

The magnetic circuit 500 can control the floating height (amount of lift) of the conveyor arm 100 so as to prevent the gas bearings 200A from being excessively lifted. The position of the object J can be controlled by controlling the floating height of the conveyor arm 100. Additionally, since there is no vibration generated due to movement of the conveyor arm 100, a stable movement of the conveyor arm 100 can be achieved. Accordingly, the magnetic circuit 500 according to the present embodiment serves not as a means for lifting the conveyor arm 100 but as a magnetic restraint means for magnetically restraining the conveyor arm 100 from being excessively lifted.

Since the magnetic circuit 500 uses the permanent magnets 506, 508 and 510, the magnetic attracting force (restraining force) is not variable. Accordingly, in order to control the floating height of the conveyor arm 100, the amount of gas to be supplied to the gas bearings 200A is controlled. The control of the amount of gas to be supplied to the gas bearings 200A can be performed by a floating height control system which comprises: a height sensor (not shown in the figure) for sensing the floating height of the conveyor arm 100; a flow sensor (not shown in the figure) for sensing the amount of gas supplied to the gas bearings 200A; and a control circuit (not shown in the figure) for controlling the amount of gas to be supplied to the gas bearings 200 in accordance with outputs of the height sensor and the flow sensor. The flow sensor and the control circuit can be integrated with each other. In such a structure, the control circuit controls the amount of gas to be supplied to the gas bearings 200 according to a feedback control so that the floating height of the conveyor arm 100 sensed by the height sensor is maintained at a predetermined height. The control circuit may include a comparator which compares the output of the height sensor with a predetermined value.

Alternatively, the magnetic circuit 500 may use electromagnets instead of the permanent magnets 506, 508 and 510. In such a case, the floating height of the conveyor arm 100 can be controlled by controlling a current supplied to the electromagnets. The control by the magnetic circuit 500 and the control of the amount of gas supplied to the gas bearings 200A may be selectively applied in accordance with the output of the height sensor. For example, if the conveyor arm 100 does not float even when the current supplied to the magnetic circuit 500 is zero, it is difficult to control the height of the conveyor arm 100 by the magnetic circuit 500 alone.

The control by the magnetic circuit 500 can be performed by a floating height control system which comprises: a height sensor (not shown in the figure) for sensing the floating height of the conveyor arm 100; a variable current source (not shown in the figure) for setting a current supplied to the coil; and a control circuit (not shown in the figure) for controlling the amount of gas to be supplied to the gas bearings 200 in accordance with outputs of the height sensor. That is, the control circuit controls the magnetic restraining force according to a feedback control by controlling the current supplied by the variable current source so that the floating height of the conveyor arm 100 sensed by the height sensor is maintained at a predetermined height. The control circuit may include a comparator which compares the output of the height sensor with a predetermined value.

If the magnetic circuit 500 comprises the yoke 502 and a guiding member (not shown in the figure) which is driven by a linear pulse motor, the conveyor arm 100 can be moved by moving the guiding member. In such a case, the magnetic circuit 500 can drive the conveyor arm 100 in an indirect manner, that is, the non-contact manner.

The magnetic circuit 500 can be provided in the closed space C1 so as to drive the conveyor arm 100 in a direct manner. Such an arrangement may be preferable in a case in which a simple motion such as, for example, a rotation is required for the conveyor arm 10. Such a structure is obvious to persons skilled in the art from the disclosure of this specification, and a detailed description will be omitted.

The conveyor arm 100 supports the object J such as a semiconductor wafer, and is able to convey the object J, for example, from a transfer chamber (for example, the closed space C1) to a process chamber. The operation required for the arm drive unit 300 to convey the object J from the transfer chamber (TC) to the process chamber (PC) is dependent on the configuration of the conveyor arm 100.

Figure 13:
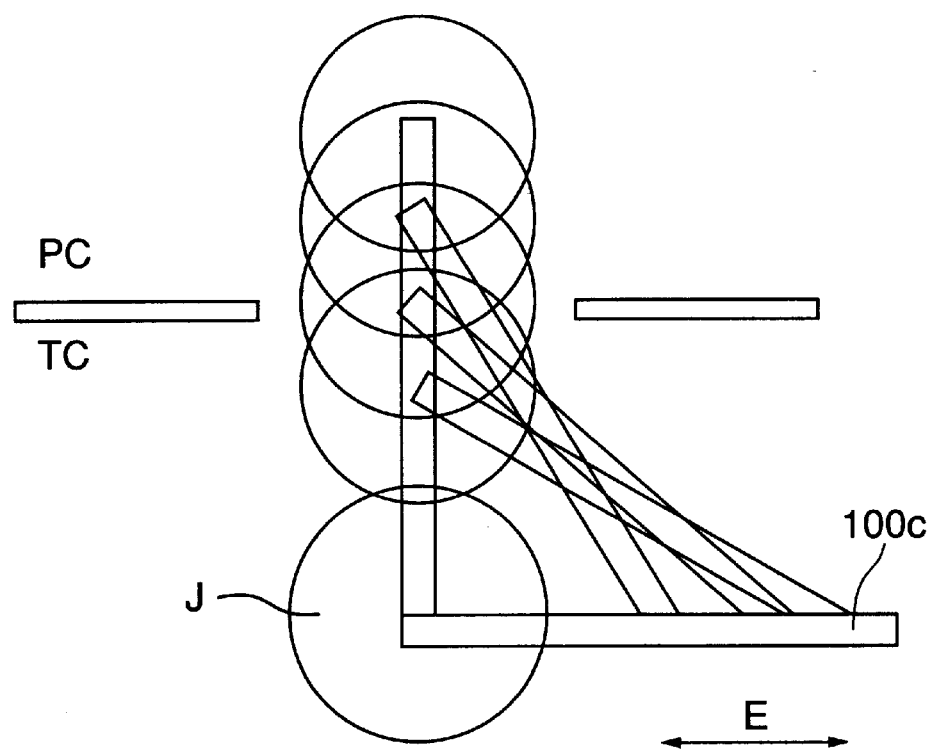
FIG. 13 is a plan view of a non-articulated arm which is applicable to the conveyor arm shown in FIG. 2.
Figure 14:
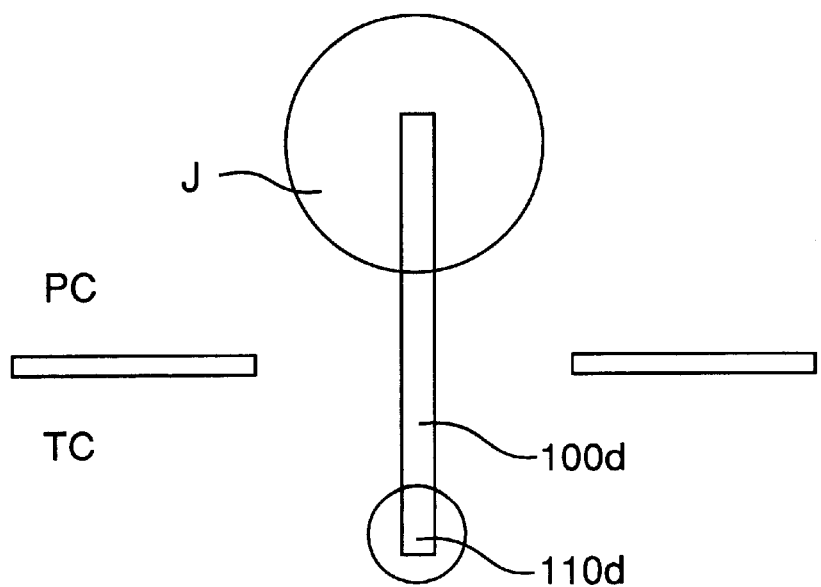
FIG. 14 is a plan view of an articulated arm which is applicable to the conveyor arm shown in FIG. 2.
Figure 15:
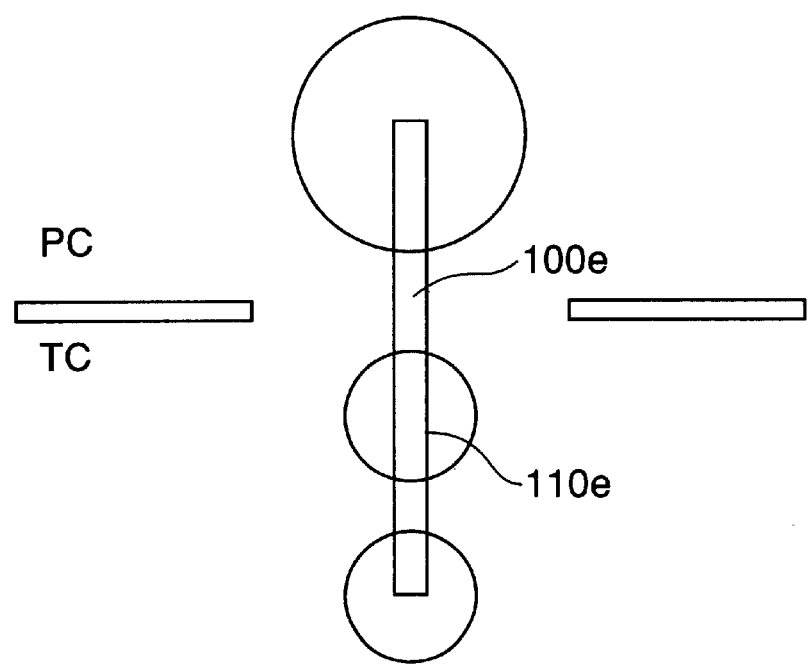
FIG. 15 is a plan view of another articulated arm which is applicable to the conveyor arm shown in FIG. 2.
Figure 16:
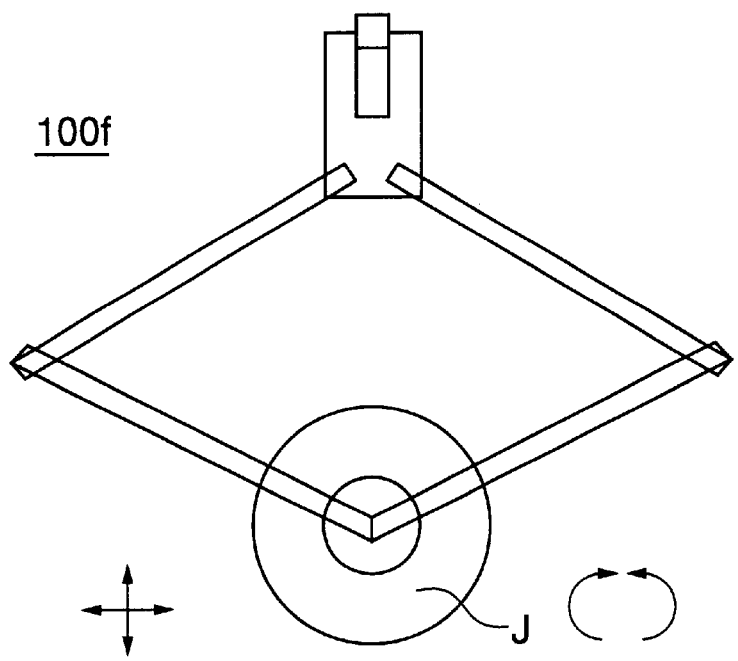
FIG. 16 is a plan views of a single pick frog leg arm.
Figure 17:
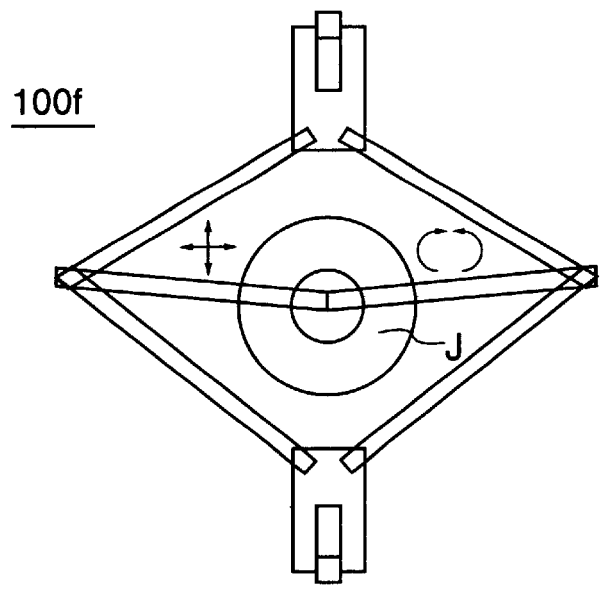
FIG. 17 is a plan view of a twin pick frog leg arm.

For example, in a case in which the conveyor arm 100 comprises a non-articulated arm 100c and the object J is conveyed to the process chamber by a transverse movement as shown in FIG. 13, the rotation by the rotational part 340 and the linear movement in the transverse direction indicated by the arrow E must be synchronously performed. Alternatively, the conveyor arm 100 may comprise a single articulated arm 100d having an articulation 100d as shown in FIG. 14, or a single articulated arm 100e having an articulation 100e in the middle of the arm. In such a case, the conveyor arm 100d or 100e can be pivoted about the articulation 100d or 100e, respectively. Additionally, the conveyor arm 100 may be provided with a plurality of articulations. For example, the conveyor arm 100 may be a single pick frog leg type arm 100f as shown in FIG. 16 or a twin pick frog leg arm 100g as shown in FIG. 17.

Figure 18:
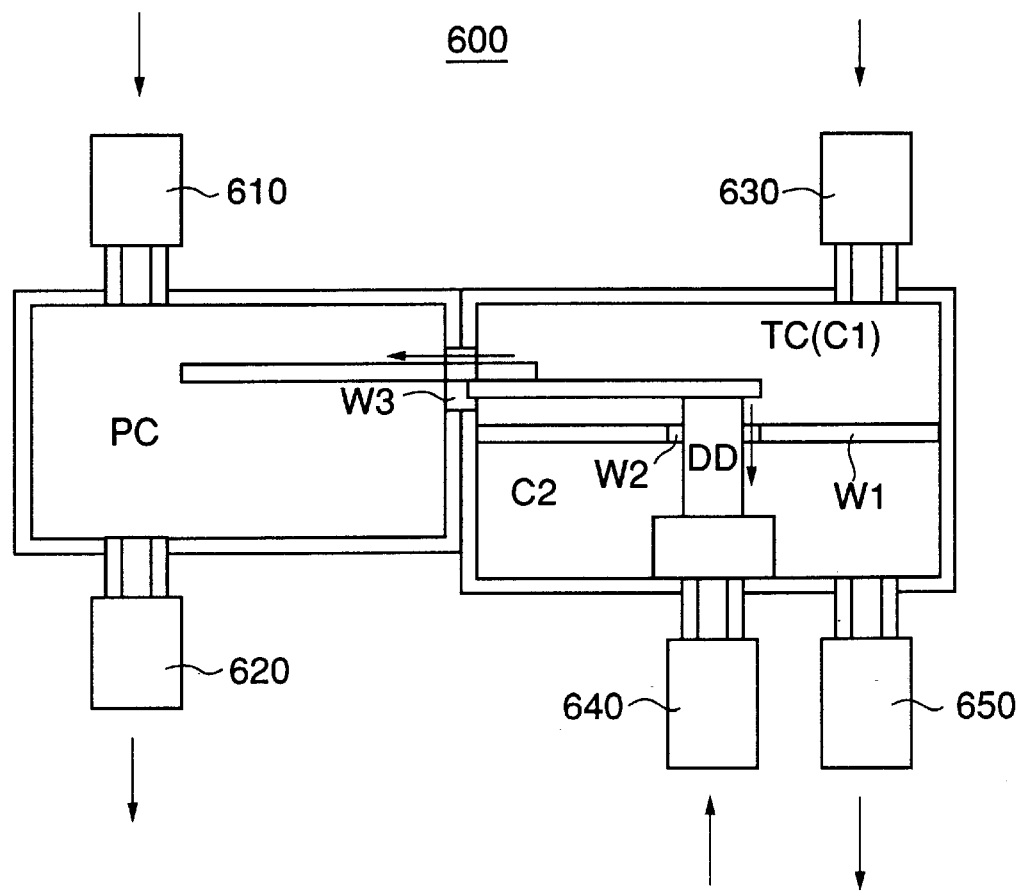
FIG. 18 is a schematic illustration of a pressure adjusting system.

A description will now be given, with reference to FIG. 18, of a method for adjusting a pressure inside the transfer chamber (closed space C1), a pressure inside the process chamber and a pressure of the closed space C2. In FIG. 18, the arm drive unit 300 drives the conveyor arm 100 by a direct drive mechanism (DD). The transfer chamber and the closed space C2 are connected via an opening W2 provided in the isolating wall W1. Additionally, the transfer chamber and the process chamber are connected through an opening W3.

A pressure adjusting system 600 shown in FIG. 18 comprises: a gas supply apparatus 610 connected to the process chamber; an exhaust apparatus 620 connected to the process chamber; a gas supply apparatus 630 connected to the transfer chamber; a gas supply apparatus 640 for supplying the gas to the gas bearing 200; an exhaust apparatus 650 connected to the closed space C2; and at least one controller for controlling those apparatuses. The gas supply apparatus 630 supplies the gas to the transfer chamber according to a constant flow control so that a normal and desired state of flow of the gas inside the transfer chamber is achieved.

The gas supply apparatus 630 supplies the gas to the transfer chamber according to a constant flow control. The gas supply apparatus 640 supplies gas to the gas bearing 200 so as to achieve a necessary floatation of the conveyor arm 100. The exhaust apparatus 650 exhausts the gas supplied by the gas supply apparatus 630 and the gas supplied by the gas supply apparatus 640 so that a desired state of flow of the gas inside the transfer chamber is achieved so that the desired negative pressure environment of the closed space C2 is maintained.

The gas supply apparatus 610 supplies a process gas to the transfer chamber according to a constant flow control, and the exhaust apparatus 620 exhausts the process gas and the gas entering the process chamber through the opening W3 so that a desired state of flow of the process gas and the gas entering from the transfer chamber is achieved.

According to the above-mentioned control of flow of the gas, the gas inside the transfer chamber (the space C1) always flows to the closed space C2 through the opening W2 and to the process chamber through the opening W3. Accordingly, the gas in the process chamber, which is not appropriate for the transfer chamber, can be prevented from flowing into the transfer chamber.

Figure 19:
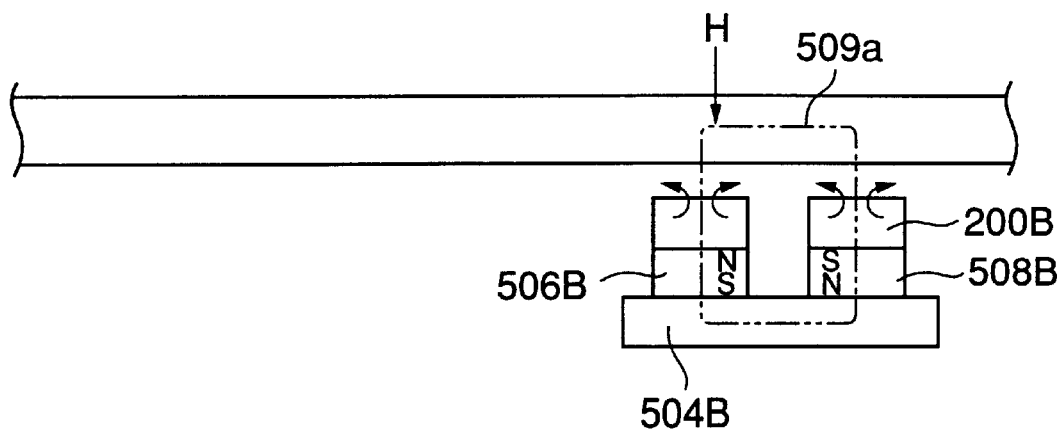
FIG. 19 is a side view of a gas bearing with a magnetic restraining arrangement.

It should be noted that although the yoke 502 and the yoke 504 are located in the different spaces C1 and C2, respectively, by the provision of the isolating wall W1 between the yokes 502 and 504, the isolating wall W1 is not necessary for the magnetic restraining arrangement. FIG. 19 shows gas bearings 200B incorporated in the magnetic restraining arrangement. Each of the gas bearings 200B has the same structure as the gas bearing 200 shown in FIG. 2. The magnetic restraining arrangement comprises the gas bearings 200B, a yoke 504B, a magnetic field generating parts 506B and 508B and a gas bearing guide 509B made of a magnetic material. In the magnetic restraining arrangement shown in FIG. 19, a closed loop magnetic circuit H is formed as indicated by a dotted line. The gas bearings 200B can be used in the position as indicated in FIG. 19 or positioned upside down.

Figure 20:
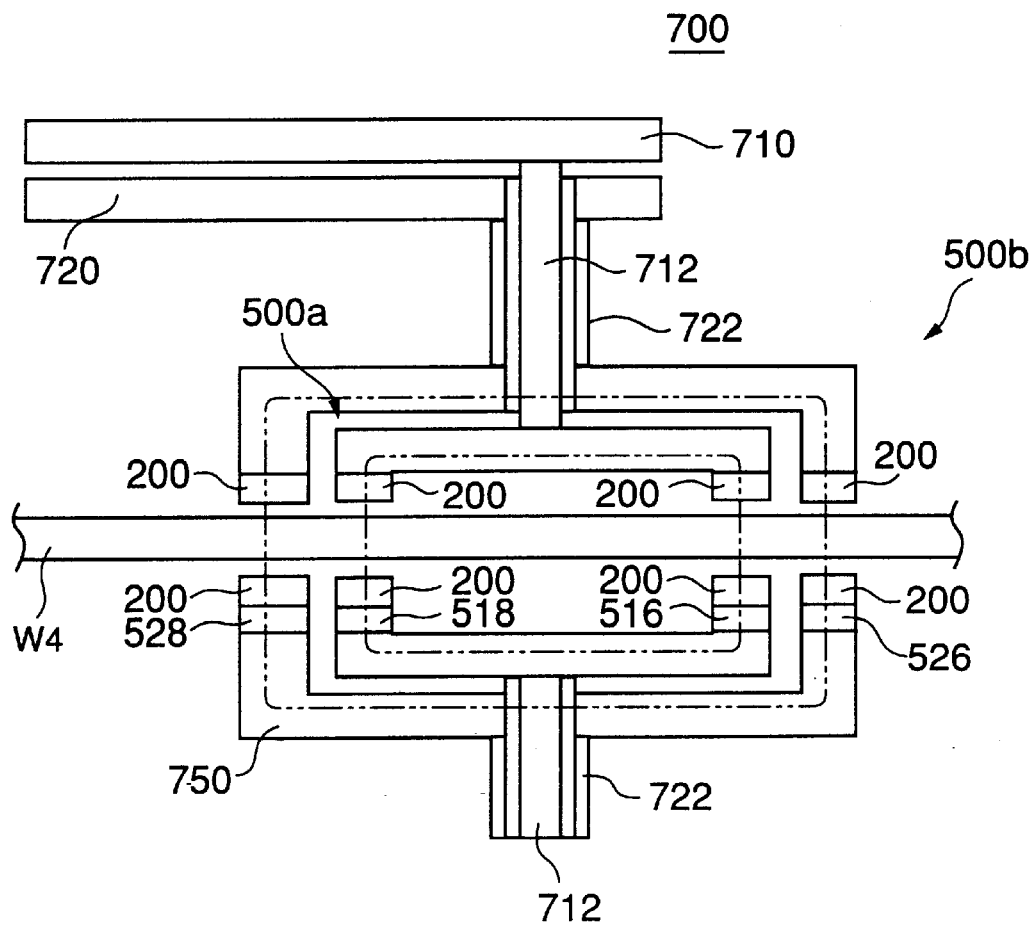
FIG. 20 is a cross-sectional view of a two-axis power transmission mechanism.

FIG. 20 shows an example of a two-axis power transmission mechanism 700 using a static pressure type gas bearing. The two-axis power transmission mechanism 700 comprises two magnetic circuits 500a and 500b connected to axes 712 and 722 which are mounted to a pair of support members 710 and 720, respectively. Each of the magnetic circuit 500a and 500b can rotate with respect to the axes 712 and 722, respectively. Similar to the magnetic restraining arrangement shown in FIG. 12, the magnetic circuits 500a and 500b are formed via an isolating wall W4, and a moving force can be transmitted via the isolating wall W4.

The present invention is not limited to the specifically disclosed embodiments, and variations and modifications may be made without departing from the scope of the present invention.

The present application is based on Japanese priority application No. 11-96148 filed on Apr. 2, 2000, the entire contents of which are hereby incorporated by reference.

What is claimed is:

1. A drive mechanism comprising:
    a movable element situated inside a chamber which is set to a predetermined negative pressure environment, the chamber, per se, having a chamber exhaust arrangement;
    a gas bearing arrangement movably supporting the movable element relative to a stationary element, the gas bearing arrangement lacking an exhaust arrangement directly associated therewith and operating under the predetermined negative pressure environment inside the chamber; and
    a drive arrangement driving the movable element from outside the chamber,
    wherein gas introduced into the chamber through the gas bearing arrangement is evacuated by the chamber exhaust arrangement.

2. The drive mechanism as claimed in claim 1, wherein the gas bearing arrangement is of a static pressure type.

3. The drive mechanism as claimed in claim 1, wherein the gas bearing arrangement uses an inert gas.

4. The drive mechanism as claimed in claim 1, wherein the gas bearing arrangement movably supports the movable element so that the movable element performs at least one of a rotational motion, a rectilinear motion and a two dimensional motion.

5. The drive mechanism as claimed in claim 1, wherein the gas bearing arrangement includes a plurality of gas bearing units separately connected to the movable element so as to stabilize a position of the movable element.

6. The drive mechanism as claimed in claim 1, wherein at least a part of the movable element constitutes a moving part of the drive arrangement.

7. The drive mechanism as claimed in claim 1, wherein the movable element is magnetically connected to the drive arrangement so that the movable element is driven by a magnetic force applied by the drive arrangement.

8. The drive mechanism as claimed in claim 1, wherein the drive arrangement forms a magnetic circuit so that magnetic flux passes through a floating surface of the gas bearing arrangement.

9. The drive mechanism as claimed in claim 1, further comprising a pressure adjusting system which maintains a predetermined negative pressure inside the chamber.

10. The drive mechanism as claimed in claim 9, wherein the pressure adjusting system includes a sensor detecting a distance between the movable element and the stationary element so as to adjust the distance between the movable element and the stationary element in accordance with a feedback control.

11. The drive mechanism as claimed in claim 1, wherein the movable element includes a conveyor to convey an object to be processed in the chamber.

12. The drive mechanism as claimed in claim 11, wherein the object processed in the chamber is one of a semiconductor wafer and an LCD glass substrate.

13. The drive mechanism as claimed in claim 11, wherein the conveyor comprises a non-articulated arm.

14. The drive mechanism as claimed in claim 11, wherein the conveyor comprises an articulated arm.

15. The drive mechanism as claimed in claim 1, wherein the drive arrangement comprises an actuator which drives the movable element to perform one of a rotational motion, a rectilinear motion and a combination of a rotational motion and a rectilinear motion.

16. A drive mechanism comprising:
    a chamber providing a predetermined negative pressure environment, the chamber, per se, having an inner surface and a chamber exhaust arrangement;
    a movable element situated inside the chamber, the movable element lacking an exhaust arrangement directly associated therewith and having an opening from which a gas is ejected so that the movable element floats on the inner surface of the chamber; and
    a drive arrangement driving the movable element,
    wherein gas introduced into the chamber through the opening is evacuated by the chamber exhaust arrangement.

17. The drive mechanism according to claim 16, wherein a part of the movable element and the inner surface together form a magnetic circuit so that the movable element is maintained in proximity to the inner surface.

18. A floating mechanism for floating a movable element on a stationary element in a chamber with a chamber exhaust arrangement, the floating mechanism comprising:
    a gas bearing adapted to be connected to the movable element, the gas bearing lacking an exhaust arrangement directly associated therewith and ejecting a gas toward a surface of the stationary element so that the movable element floats on the surface of the stationary element; and
    a magnetic circuit generating a magnetic field which maintains the movable element in proximity to the surface of the stationary element,
    wherein gas introduced into the chamber through the gas bearing is evacuated by the chamber exhaust arrangement.

19. The floating mechanism as claimed in claim 18, wherein the magnetic circuit generates a magnetic field which causes the movable element to be attracted toward the surface of the stationary element.

20. The floating mechanism as claimed in claim 18, wherein the magnetic circuit includes at least one of a permanent magnet and an electromagnet.

21. The floating mechanism as claimed in claim 18, wherein the gas bearing serves as a part of the magnetic circuit.

22. A drive mechanism comprising:
    a movable element situated inside a chamber which is set to a predetermined negative pressure environment;
    a chamber exhaust arrangement attached to a wall of the chamber to evacuate gas introduced into the chamber;
    a gas bearing arrangement attached to the movable element and movably supporting the movable element relative to a stationary element, the gas bearing arrangement operating under the predetermined negative pressure environment inside the chamber; and
    a drive arrangement driving the movable element from outside the chamber.

23. A drive mechanism comprising:
    a chamber providing a predetermined negative pressure environment, the chamber having an inner surface;
    a chamber exhaust arrangement attached to a wall of the chamber to evacuate gas introduced into the chamber;
    a movable element situated inside the chamber, the movable element having an opening from which a gas is ejected so that the movable element floats on the inner surface of the chamber; and a drive arrangement driving the movable element.

24. A floating mechanism for floating a movable element on a stationary element in a chamber, the chamber having a chamber exhaust arrangement, the floating mechanism comprising:

a gas bearing adapted to be connected to the movable element, the gas bearing lacking an exhaust arrangement directly associated therewith and ejecting a gas toward a surface of the stationary element so that the movable element floats on the surface of the stationary element; and a magnetic circuit generating a magnetic field which maintains the movable element in proximity to the surface of the stationary element, wherein gas introduced into the chamber is evacuated by the chamber exhaust arrangement.

* * * * *